(12) United States Patent
Steffens et al.

(10) Patent No.: US 9,195,147 B2
(45) Date of Patent: Nov. 24, 2015

(54) LITHOGRAPHIC APPARATUS AND DEVICE MANUFACTURING METHOD INVOLVING A SEAL BETWEEN A TABLE AND A COMPONENT

(75) Inventors: Koen Steffens, Veldhoven (NL); Ronald Van Der Ham, Maarheeze (NL); Erik Henricus Egidius Catharina Eummelen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1510 days.

(21) Appl. No.: 12/606,539

(22) Filed: Oct. 27, 2009

(65) Prior Publication Data

US 2010/0110410 A1    May 6, 2010

Related U.S. Application Data (60) Provisional application No. 61/193,109, filed on Oct. 29, 2008.

(51) Int. Cl.
*G03B 27/52* (2006.01)
*G03F 7/20* (2006.01)

(52) U.S. Cl.
CPC .................. *G03F 7/70341* (2013.01)

(58) Field of Classification Search
CPC .. G03F 7/70341; G03F 7/707; G03F 7/70716
USPC .............. 355/30, 53, 55, 72, 75, 77
See application file for complete search history.

(56) References Cited

U.S. PATENT DOCUMENTS

| | | |
|---|---|---|
| 4,509,852 A | 4/1985 | Tabarelli et al. |
| 7,075,616 B2 | 7/2006 | Derksen et al. |
| 7,310,132 B2 | 12/2007 | Van Der Schoot et al. |
| 7,760,324 B2 | 7/2010 | Benschop et al. |
| 8,035,798 B2 | 10/2011 | Sengers et al. |
| 2004/0136494 A1 | 7/2004 | Lof et al. |
| 2004/0207824 A1 | 10/2004 | Lof et al. |
| 2004/0211920 A1 | 10/2004 | Derksen et al. |
| 2005/0219482 A1* | 10/2005 | Baselmans et al. ............ 355/30 |
| 2005/0264778 A1* | 12/2005 | Lof et al. ..................... 355/53 |
| 2006/0038968 A1 | 2/2006 | Kemper et al. |
| 2006/0119809 A1 | 6/2006 | Verhagen et al. |

(Continued)

FOREIGN PATENT DOCUMENTS

| | | |
|---|---|---|
| EP | 1 420 300 A2 | 5/2004 |
| EP | 1 429 188 A2 | 6/2004 |

(Continued)

OTHER PUBLICATIONS

Japanese Office Action mailed Oct. 19, 2011 in corresponding Japanese Patent Application No. 2009-242950.

(Continued)

*Primary Examiner* — Peter B Kim
(74) *Attorney, Agent, or Firm* — Pillsbury Winthrop Shaw Pittman LLP (57) ABSTRACT

A seal between a table and a component in a lithographic apparatus is disclosed. The seal bridges a gap between the component and the table when the component is in a position relative to the table. The component is moveable, in use, relative to the table and in an embodiment is attached to the table. The seal may be integral with the component or the table.

20 Claims, 5 Drawing Sheets

(56) References Cited

U.S. PATENT DOCUMENTS

| | | | |
|---|---|---|---|
| 2007/0114451 A1 | 5/2007 | Jansen et al. | |
| 2007/0216881 A1* | 9/2007 | Van Der Schoot et al. | 355/53 |
| 2007/0216882 A1 | 9/2007 | Benschop et al. | |
| 2008/0106715 A1* | 5/2008 | Lin et al. | 355/53 |
| 2008/0165331 A1 | 7/2008 | Jacobs et al. | |
| 2008/0186460 A1 | 8/2008 | Auer-Jongepier et al. | |
| 2008/0212046 A1 | 9/2008 | Riepen et al. | |
| 2009/0128790 A1* | 5/2009 | Shibazaki | 355/53 |

FOREIGN PATENT DOCUMENTS

| | | |
|---|---|---|
| JP | 2004-289127 | 10/2004 |
| JP | 2004-289128 | 10/2004 |
| JP | 2005-005707 | 1/2005 |
| JP | 2006-200562 | 8/2006 |
| JP | 2006-202825 | 8/2006 |
| JP | 2007-142168 | 6/2007 |
| JP | 2007-150308 | 6/2007 |
| JP | 2007-158343 | 6/2007 |
| JP | 2007-235179 | 9/2007 |
| JP | 2007-251165 | 9/2007 |
| JP | 2007-258704 | 10/2007 |
| JP | 2008-118114 | 5/2008 |
| JP | 2008-130745 | 6/2008 |
| JP | 2008-153651 | 7/2008 |
| JP | 5175821 | 4/2013 |
| WO | WO 99/49504 A1 | 9/1999 |
| WO | WO 2005/064405 A2 | 7/2005 |

OTHER PUBLICATIONS

Japanese Office Action mailed Aug. 31, 2012 in corresponding Japanese Patent Application No. 2009-242950.

Japanese Office Action mailed Sep. 24, 2013 in corresponding Japanese Patent Application No. 2012-006058.

* cited by examiner

LITHOGRAPHIC APPARATUS AND DEVICE MANUFACTURING METHOD INVOLVING A SEAL BETWEEN A TABLE AND A COMPONENT

This application claims priority and benefit under 35 U.S.C. §119(e) to U.S. Provisional Patent Application No. 61/193,109, entitled "Lithographic Apparatus and Device Manufacturing Method", filed on Oct. 29, 2008. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

Figure 2:
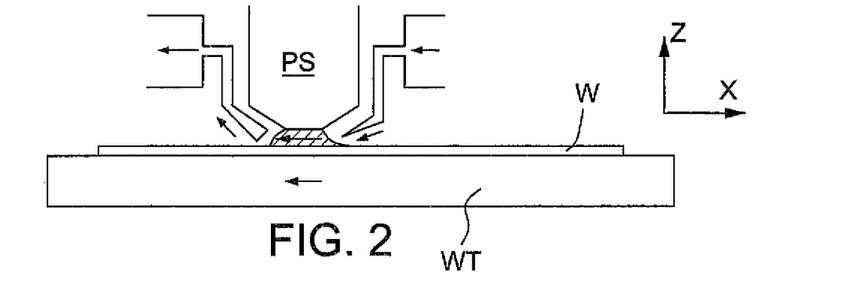
FIGS. 2 and 3 depict a liquid supply system for use in a lithographic projection apparatus.
Figure 3:
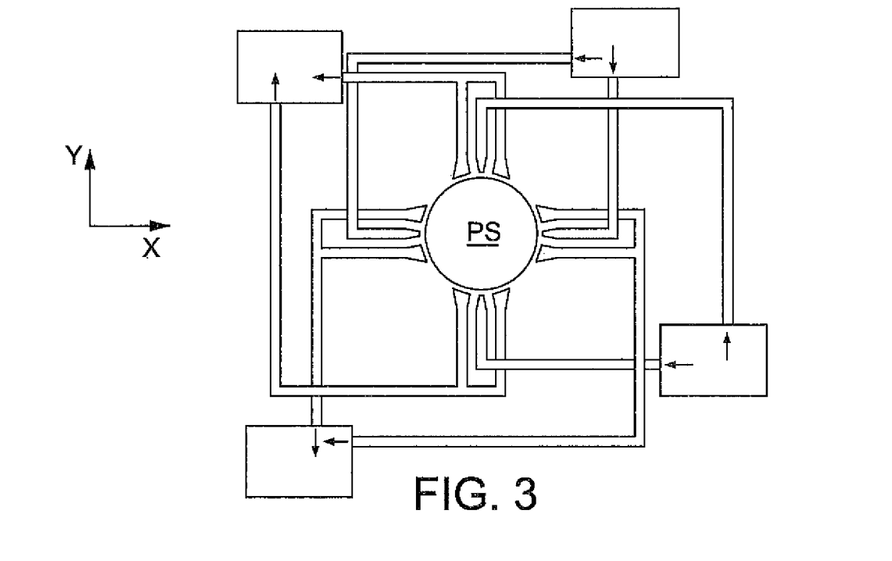

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate W, preferably along the direction of movement of the substrate W relative to the final element, and is removed by at least one outlet after having passed under the projection system PS. That is, as the substrate W is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
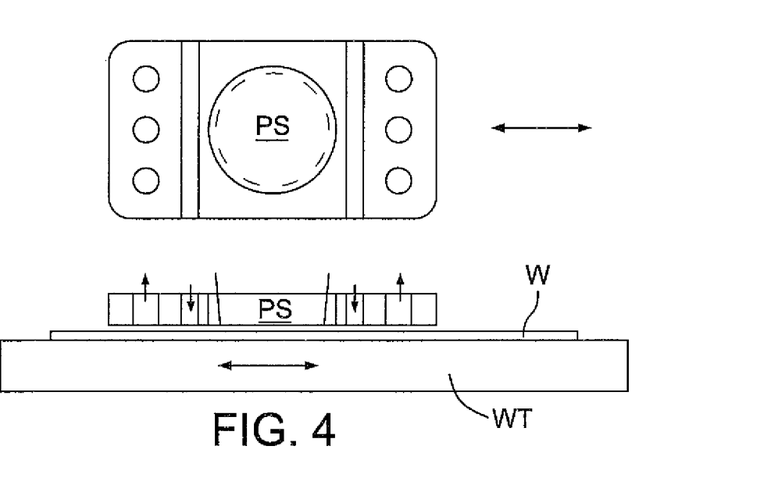
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive), Note that the direction of flow of fluid and of the substrate W is shown by arrows in FIG. 4.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

SUMMARY

The formation of bubbles in immersion liquid is to be avoided. Any bubbles in the immersion liquid may find their way into the immersion space which is between the final element of a projection system and the substrate. Bubbles in the immersion space can lead to imaging errors and their presence is to be avoided.

Loss of immersion liquid out of the immersion space in localized area lithographic apparatus is to be avoided. Loss of immersion liquid can lead to drying stains as the immersion liquid evaporates.

It is desirable, for example, to provide a lithographic apparatus in which the chance of bubbles being generated is reduced and/or the chance of liquid loss from the immersion space (in the case of a localized area lithographic apparatus) is reduced.

According to an aspect of the invention, there is provided a lithographic apparatus comprising a table, a component attached to and moveable, in use, relative to the table, and a seal to bridge a gap between the component and the table when the component is in a position relative to the table.

According to an aspect of the invention, there is provided a lithographic apparatus, comprising a table, a component moveable, in use, relative to the table, the component comprising an integral seal to bridge a gap between the component and the table when the component is in a position relative to the table, and an under pressure source to generate an under pressure in the gap.

According to an aspect of the invention, there is provided a method of sealing between a table and a component in a lithographic apparatus, wherein the component is attached to and moveable, in use, relative to the table, the method comprising: positioning a seal between the component and the table when the component is in a position relative to the table such that the seal bridges the gap between the component and the table.

According to an aspect of the invention, there is provided a bridge body for use in a lithographic apparatus to bridge a gap between two tables during substrate swap, the bridge body including a seal to bridge a gap between the bridge body and one of the tables.

According to an aspect of the invention, there is provided a shutter member which is removably attachable to a bottom of a fluid confinement structure, the shutter member comprising first and second seals, each to seal across a gap between the shutter member and a substrate table when the shutter member is placed on the substrate table, the first and second seals being around edges of opposite surfaces of the shutter member.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
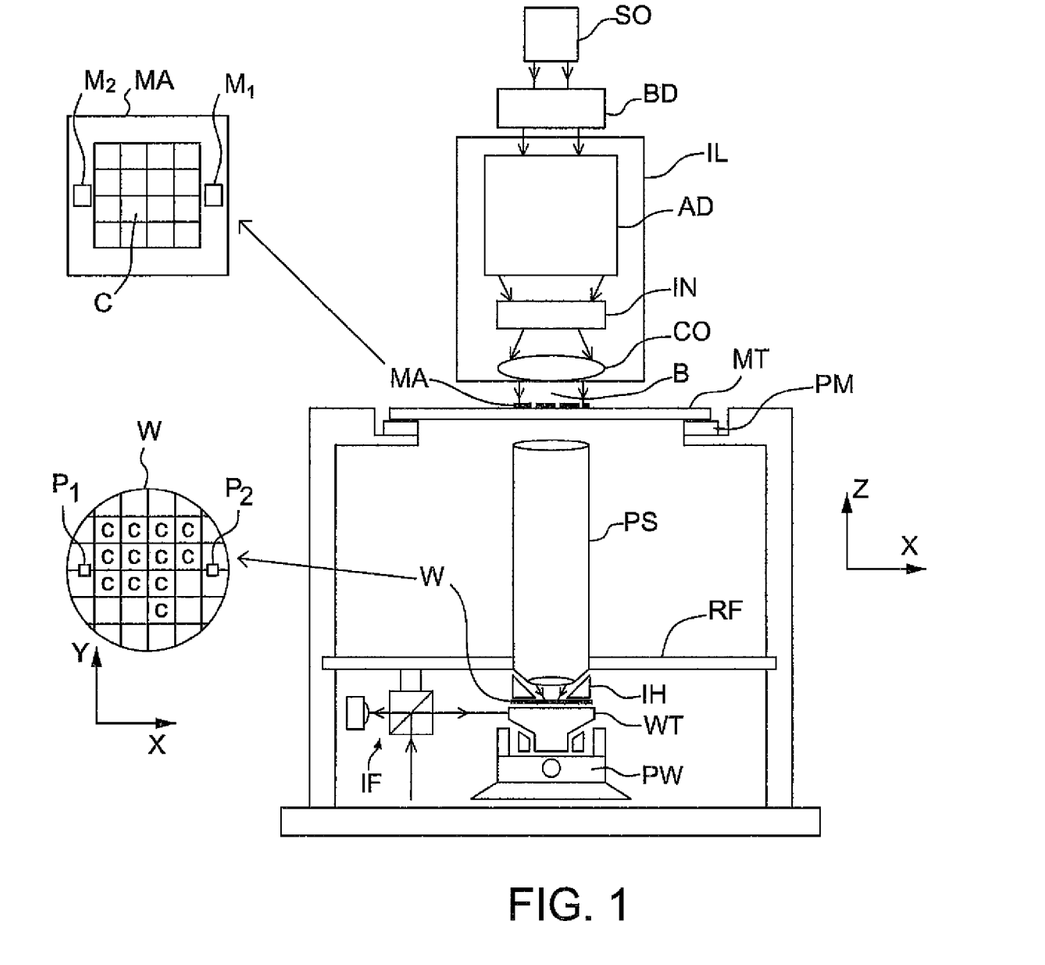
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement in which substantially the whole of the substrate and optionally part of the substrate table is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
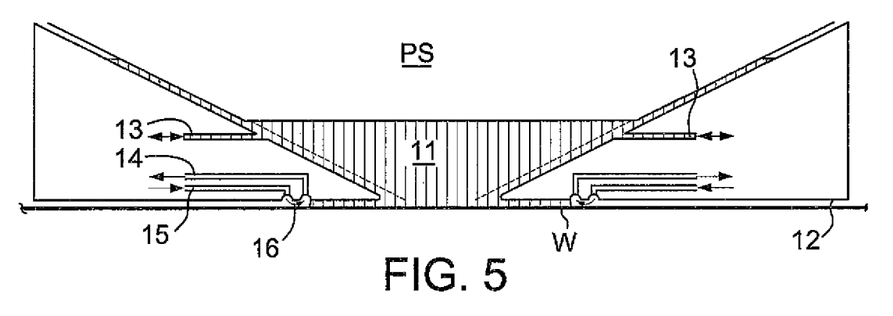
FIG. 5 depicts a further liquid supply system for use in a lithographic projection apparatus.

Another arrangement which has been proposed is to provide the liquid supply system with a liquid confinement structure which extends along at least a part of a boundary of the space between the final element of the projection system and the substrate table. Such an arrangement is illustrated in FIG. 5. The liquid confinement structure is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system or fluid handling structure with a bather member or fluid confinement structure 12, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid confinement structure 12 is substantially stationary relative to the projection system PS in the XY plane though there may be some relative movement in the Z direction (in the direction of the optical axis). In an embodiment, a seal is formed between the fluid confinement structure 12 and the surface of the substrate W and may be a contactless seal such as a gas seal or fluid seal.

The fluid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the fluid confinement structure 12 positioned below and surrounding the final element of the projection system PS. Liquid is brought into the space 11 below the projection system PS and within the fluid confinement structure 12 by liquid inlet 13. The liquid may be removed by liquid outlet 13. The fluid confinement structure 12 may extend a little above the final element of the projection system PS. The liquid level rises above the final element so that a buffer of liquid is provided. In an embodiment, the fluid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid is contained in the space 11 by the gas seal 16 which, during use, is formed between the bottom of the fluid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor (whether or not it works in two phase mode) as disclosed, for example, in United States patent application publication no US 2006-0038968. In an embodiment, a single phase extractor may comprise an inlet which is covered in a porous material which is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 nm. In an embodiment, the porous material is at least slightly liquidphilic (e.g., hydrophilic), i.e. having a contact angle of less than 90° to the immersion liquid, e.g. water. Another arrangement which is possible is one which works on a gas drag principle. The so-called gas drag principle has been described, for example, in United States patent application publication no. US 2008-0212046 and U.S. patent application no. U.S. 61/071,621 filed on 8 May 2008. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan. An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in U.S. patent application no. U.S. 61/136,380 filed on 2 Sep. 2008.

In an immersion lithographic apparatus there are one or more gaps between components over which the fluid supply system is or becomes located when the fluid supply system is at least partly confining or supplying fluid. While in such a location over a gap, bubbles may be entrapped into the fluid. If those bubbles find their way into the space 11, this can lead to imaging errors and thereby defective substrates.

For example, inclusion of bubbles may particularly occur when a gap passes under an edge of a fluid confinement structure 12, unless measures are taken. If the fluid confinement structure 12 is a so called localized area fluid confinement structure then features on the undersurface of the fluid confinement structure 12 for sealing liquid in the space 11 can deleteriously interact with the gap.

Location over such a gap can lead to liquid loss from the liquid confinement structure 12 of a localized area liquid confinement structure 12. Liquid left behind can evaporate. This may lead to cold spots and/or drying stains, both of which are deleterious. Furthermore, transport of liquid from the gap (which may be contaminated) onto the top surface of the substrate W and/or substrate table WT may occur which may lead to imaging errors. Additionally or alternatively, if liquid is extracted through the gap (for example by the action of an under pressure), a large thermal load can be exerted onto the components on either side of the gap.

An embodiment of the present invention addresses one or more of these or other difficulties by providing a seal 220, 240 to bridge a gap 115, 125, 135 between a table and a component which passes under the fluid supply system, when the fluid supply system is at least partly confining or supplying fluid. The table may be a table that in use is opposed to a liquid confinement structure 12 or a table that is configured to support a substrate, that comprises a sensor and/or that comprises a cleaning station.

As will be described below, the seal 220, 240, 250 may be used for any component, but particularly for components which are moveable, in use, relative to a table WT, WT1, WT2, ST. In an embodiment, the component is (mechanically) attached to the table (e.g. by a fastening which allows the relative movement).

The table may be a first substrate table WT1, a second substrate table WT2 or a measurement table ST. The table may be a table used during substrate swap to act as a shutter member to maintain liquid in the fluid confinement structure 12 during substrate swap. That is, the table may have as its sole purpose to be positioned under the fluid confinement structure 12 between imaging of two substrates W.

The component may be a substrate W. The component may be a so called closing disk CLD which is a shutter member which is removably attachable to a bottom of a fluid confinement structure 12 in place of a substrate W during substrate swap. Such a closing disk CLD may be mounted on a substrate table WT1, WT2, a measurement table ST or on a table of its own. The component may be a bridge 200 which is used to bridge the gap between a first substrate table WT1 and: (i) a second substrate table WT2, or (ii) a measurement table ST, or (iii) a shutter member table, during substrate swap.

An under pressure source may or may not be used in order to pull the seal onto a sealing surface of the component or table and thereby to form the seal. An under pressure source helps in maintaining the seal liquid tight by applying a downward pressure on the seal. However, this is at the expense of an increase in complexity due to the need to provide a channel for connecting an under pressure source to the gap 115.

Figure 6:
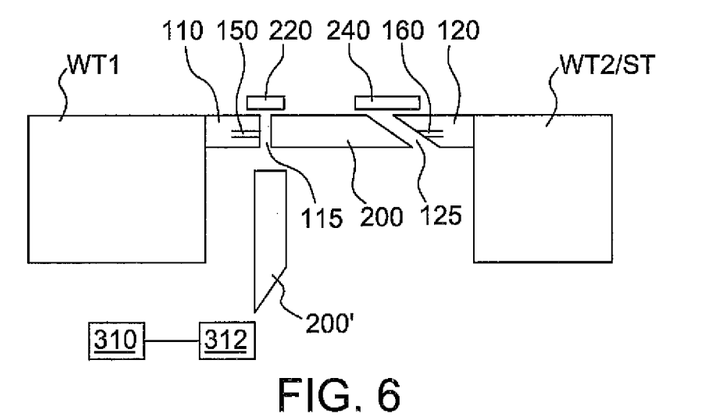
FIG. 6 is a schematic illustration, in cross-section, of adjacent tables according to an embodiment of the invention.

FIG. 6 illustrates an embodiment of the invention. In this embodiment the seal 220, 240 is attached to the component which is a bridge 200. The seal 220, 240 may be attached by glue or another fastener such as a screw. The seal could be a sticker (i.e. a liquid impermeable member which may be as thin as a membrane). The seal may have a liquidphobic (e.g., hydrophobic) surface. The seal 220, 240 may or may not be integral with the component in this or any other embodiment. The seal 220, 240 could equally well be attached to or be part of the substrate table WT1, WT2.

In the FIG. 6 embodiment, the bridge 200 is attached to a first substrate table WT1. The bridge 200 is moveable between a position in which it bridges a gap between the first substrate table WT1 and a second substrate table WT2 (or a measurement table ST) and a store position (indicated at 200'). The first and second substrate tables WT1, WT2 may be tables other than substrate tables. For example, one of the tables could be a measurement table ST.

The bridge 200 is attached to the first substrate table WT1 and, in use, is moveable relative to the first substrate table WT1. The bridge 200 is used so that the aperture in the bottom of the fluid confinement structure 12 is blocked as the first substrate table WT1 moves from under the projection system PS and the second substrate table WT2 moves under the projection system PS. Therefore the first substrate table WT1 and second substrate table WT2 are moved together under the projection system PS so that liquid remains in the space 11 during substrate swap. The bridge 200 may be attached to the first substrate table WT1 or to the second substrate table WT2.

A first seal 220 is provided to bridge the gap 115 between the bridge 200 and a bridge head 110 of the first substrate table WT1. For the purposes of this description, the bridge head 110 is considered to be part of the first substrate table WT1. In this way, as the gap 115 between the bridge head 110 and the bridge 200 passes under the space 11, the gap 115 is blocked from the space 11 by the seal 220.

A second seal 240 is positioned over the gap 125 between the bridge 200 and a bridge head 120 of the second substrate table WT2. In this way the gap 125 between the bridge 200 and the bridge head 120 is blocked. That is, the seal 240 separates the gap 125 from the immersion space 11 as the bridge 200 moves from under the projection system PS and the second substrate table WT2 moves under the projection system PS as the bridge 200 moves out from under the projection system PS.

In an embodiment the seal 220, 240 fills or obstructs the top of the gap 115, 125. The seal 220, 240 may be a resilient member. The seal 220, 240 may be compressible. The seal 220, 240 may be a (hollow) o-ring, for example. In one embodiment the seal 220, 240 prevents fluid from flowing through the gap 115, 125. In one embodiment the top surface of the seal 220, 240 is substantially flush i.e. co-planar with the top surface of the bridge head 110, 120 and the bridge 200.

Figure 8:
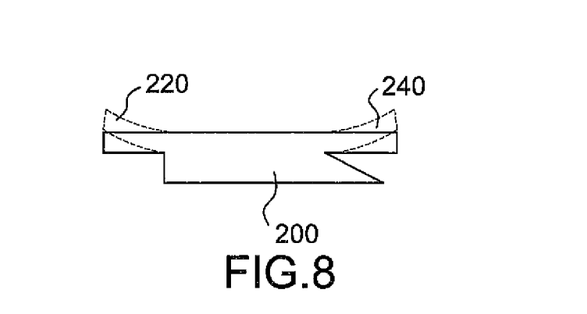
FIG. 8 is a schematic illustration, in cross-section, of a bridge according to an embodiment of the invention.

The first seal 220 may be attached to the bridge 200 or may be attached to the bridge head 110. A free end of the first seal 220, opposite the fixed end, seals to a sealing surface of the top surface of the substrate table WT1, WT2 or component to which the seal 220 is not attached. In either case the first seal 220 may be integral with the object to which it is attached at a fixed end. That is, the top surface of the object to which the first seal 220 is attached and the first seal 220 are formed from a solid material (as is illustrated in FIG. 8 for the case of the first seal 220 being integral with the bridge 200). Alternatively the top surface of the bridge head 110 and the first seal 220 are formed from the same block of material. Alternatively the first seal 220 may be made integral with the object to which it is attached by gluing or by another fastener such as a bolt or screw. In one embodiment, at least part of the integral first seal 220 is resilient and may be flexible. The same applies to the second seal 240.

One of the two seals 220, 240 may be attached to (or integral with) the bridge 200 and the other of the two seals 220, 240 may be attached to (or integral with) one of the bridge heads 110, 120. Alternatively both of the seals 220, 240 may be attached to the bridge 200 (or integral with the bridge 200) or both of the seals 220, 240 may be attached to (or integral with) one of the bridge heads 110, 120.

It is desirable that the bridge 200 is rotatably moveable relative to the first substrate table WT1 to which it is attached. Rotational movement is easiest to arrange and may take up less space than displaceable movement. However, the bridge 200 may move from its store position (indicated by 200') to the position in which it bridges a gap (the use position) at least partly by displacement movement. In this way sliding contact between seal 220, 240 and the sealing surface to which the seal seals in use (i.e. relative movement between those two parts whilst they are in contact) can be avoided. For example, if both seals 220, 240 are attached to (or integral with) the bridge 200, the bridge 200 may be moved in the following way. Rotational movement is used to move the bridge 200 to a position at which the seals 220, 240 are above the top surface of the first and second substrate tables WT1, WT2 (and their respective sealing surfaces). Then, once the second substrate table WT2 has moved into position, a vertical motion downwards of the bridge 200 (i.e. away from the projection system PS in a direction substantially parallel with the optical axis of the apparatus) occurs. In this way the seals 220, 240 come into contact with sealing surfaces on the bridge heads 110, 120 respectively by vertical motion without any sliding contact. Other orders of motion may be appropriate to achieve the same result.

Figure 7:
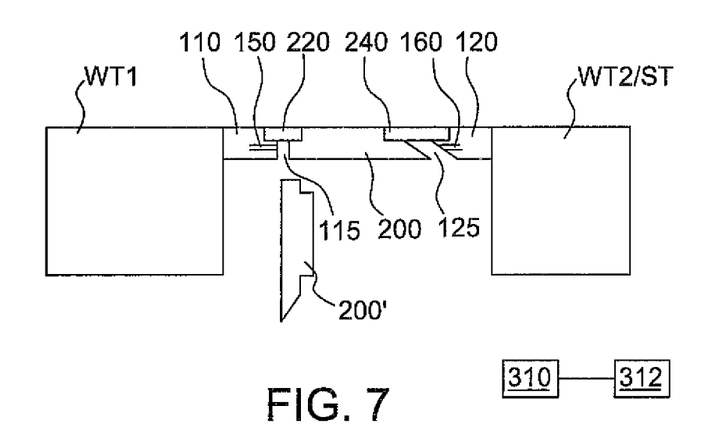
FIG. 7 is a schematic illustration, in cross-section, of adjacent tables according to an embodiment of the invention.

FIG. 7 shows an embodiment which is the same as the embodiment of FIG. 6 except as described below. In this embodiment the first and second seals 220, 240 are positioned in recesses in the top surface of the bridge 200 and the bridge heads 110, 120. Thus, the first and second seals 220, 240 have a top surface which is substantially co-planar with the top surfaces of the first and second substrate tables WT1, WT2 and the bridge heads 110, 120. This arrangement could prevent damage due to collision with the liquid confinement structure 12. In an embodiment, the seal 220, 240 is in a recess on only one side. In an embodiment, the seal 220, 240 fits in a recess in an edge surface. For example a compressible seal can fit in a concave recess. This would require linear relative movement which is possible, for example by using a cam in the mechanism for moving the bridge 200 relative to the first substrate table WT1. In an embodiment, the liquid confinement structure 12 can be lifted away from the first substrate table WT1 when over a gap 115, 125 to avoid collision with a seal 220, 240 which is not flush with the top surface of the first substrate table WT1. This may be at the expense of an increase in immersion liquid loss from the liquid confinement structure 12.

In one embodiment the seals 220, 240 may be arranged to have a certain amount of pre-bend. If the materials of the seals 220, 240 are elastically deformable, by applying a force to the seals, they can be bent into contact with their sealing surfaces.

FIG. 8 illustrates a bridge 200 in which both seals 220, 240 are integral with the bridge 200 (or at least with the material from which the top surface of the bridge 200 is made). Both seals 220, 240 have a pre-bend. That is, their non fixed ends which come into contact with sealing surfaces of the bridge heads 110, 120 are, in a natural state without any force being applied, higher than their fixed ends which are fixed to the (or integral with) bridge 200. The apparatus includes a device to apply a force to the seals 220, 240 to bend them such that their ends come into contact with sealing surfaces of the bridge heads 110, 120. One such device is an under pressure source 150, 160 which places the gap 115, 125 under the respective seal 220, 240 at an under pressure. This thereby exerts a force on the seal 220, 240 to bring its free end into contact with a sealing surface of the respective bridge head 110, 120.

The seal 220, 240 is desirably kept thin, desirably less than or equal to 50 µm, more desirably less than 20 µm. The thinner a seal, the less it will stand proud of the surface to which it seals. The less a seal stands proud, the less disturbance to fluid flowing over it and so the lower the chance of a bubble being included and/or of immersion liquid loss occurring. The seals 220, 240 may be made of a material such as stainless steel, polytetrafluoroethylene (e.g., Teflon polytetrafluoroethylene) or a fluoroelastomer (e.g. Viton fluoroelastomer). The seals may have a liquidphobic surface. For example, the static contact angle of immersion liquid with the surface of the seal which comes into contact with immersion liquid may be between 10 and 80 degrees, desirably less than 60 degrees, more desirably less than 40 degrees or less than 30 degrees.

Figure 9:
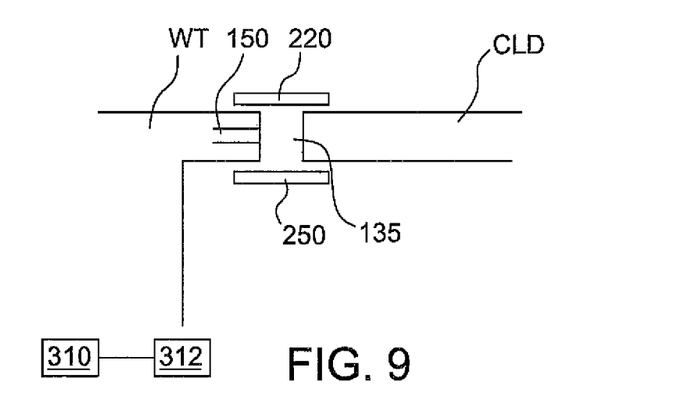
FIG. 9 depicts, in cross-section, a closing disk and table according to an embodiment of the invention.

Other components may have similar seals to those described above in relation to the component being a bridge 200. Other components are not necessarily attached to the table and may be removable. For example, seals may be applied to a closing member or to a substrate. FIG. 9 illustrates an embodiment in which a seal 220 similar to the seal 220 of FIG. 6 is present over a gap 135 between a substrate table WT and a closing member, e.g., a closing disk CLD. In this case a first seal 220 is desirably attached to or integral with the closing disk CLD rather than the substrate table WT. This is because the closing disk CLD will be removed from the substrate table WT in the vertical direction (i.e. it will be lifted upwards).

An under pressure source 150 is provided to place the gap 135 between the closing disk CLD and the substrate table WT at an under pressure.

In one embodiment a second seal 250 is present on the other side of the gap 135 to the first seal 220. Therefore, at least part of the closing disk CLD and/or at least part of the substrate table WT is between the second seal 250 and the space above the closing disk CLD and/or the substrate table WT. In other words at least part of the closing disk CLD is positioned between the second seal 250 and the top surface of the closing disk CLD. In this embodiment the second seal 250 is desirably attached to or integral with the substrate table WT.

The property of the second seal 250 is similar to that of the first (top) seal 220. However, this is not necessarily the case and, for example, the second (bottom) seal 250 could have a pre-bend applied to it such that its free end projects above its lower end and so that it is bent as the closing disk CLD is lowered onto it.

Alternatively the second (bottom) seal 250 could be such that it is bent by the under pressure generated in the gap 135 by the under pressure source 150, in the same way as the first (top) seal 220.

The arrangement in FIG. 9 with two seals 220, 250 is particularly advantageous if an under pressure is applied above the first (top) seal 220. For example, sealing features on the fluid confinement structure 12 may include an opening which is subjected to an under pressure. Such an under pressure can disrupt the first (top) seal 220 and lift it away from its sealing surface. However, any such under pressure would increase the sealing force with which the second (bottom) seal 250 is attracted to its sealing surface thereby increasing its sealing power. Therefore, in this case liquid is unlikely to get past the second (bottom) seal 250. Therefore the presence of the second (bottom) seal 250 is advantageous because it substantially prevents immersion liquid from leaking underneath the closing disk CLD. Any such liquid which finds its way under the closing disk CLD would adhere to the underside of the closing disk CLD and could drip onto the substrate W or other components as they move underneath the closing disk CLD during substrate swap.

A second (bottom) seal 250 as illustrated in FIG. 9 could also be used in conjunction with a bridge 200, though this is not illustrated or described above in relation to FIGS. 6, 7 and 8. The use of a second (bottom) seal 250 in conjunction with a bridge 200 can prevent liquid from dripping through the gap 115, 125 onto underlying components. Indeed, only a second (bottom) seal 250 may be used and no first (top) seal 220 may be present. In this way the second (bottom) seal 250 closes a connection towards ambient pressure and therefore increases the negative pressure inside the gap 115, 125. This could improve functionality. A similar arrangement could be used in any other embodiment described.

The embodiment of FIG. 9 is also suitable to be applied to a substrate W rather than a closing disk CLD.

Figure 10A:
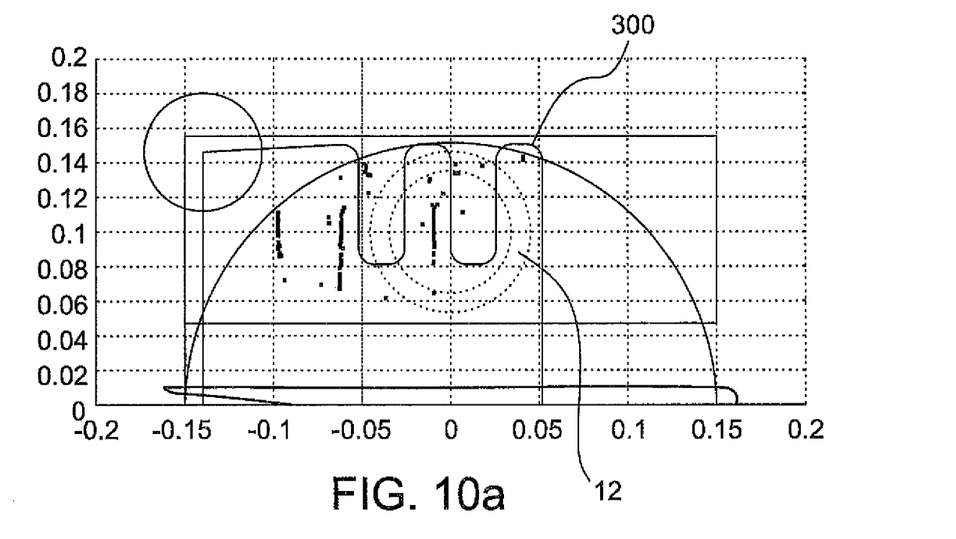
FIGS. 10a and 10b depict, in plan, the occurrence of liquid loss during meandering of a substrate under a fluid confinement structure.
Figure 10B:
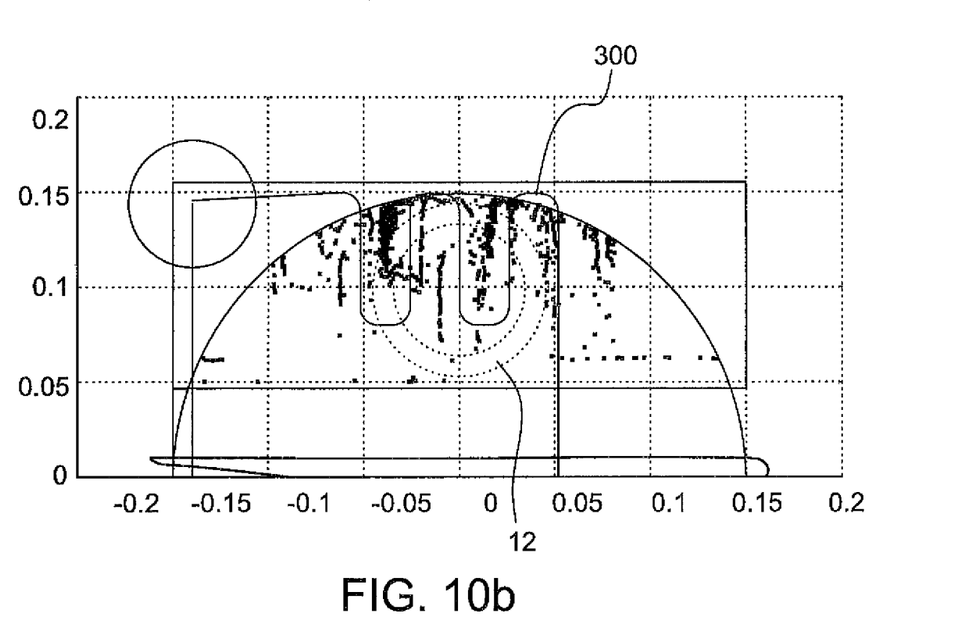

FIGS. 10a and b illustrate experimental results of an embodiment in which a top seal 220 such as that in FIG. 9 is applied around the edge of a substrate W to bridge the gap between the substrate W and the substrate table WT.

FIGS. 10a and b illustrate, with squares, the occurrence of liquid loss during movement of a substrate W along line 300 under a liquid confinement system 12 for six substrates. In FIG. 10a, a seal 220 as illustrated in FIG. 9 (but without the bottom seal 250) is used whereas in FIG. 10b no seal 220 or 250 is present and the gap 135 between the substrate table WT and the substrate W simply has an under pressure applied. As can be seen, far less liquid loss is present with the seal 220 than without such a seal.

Figure 11:
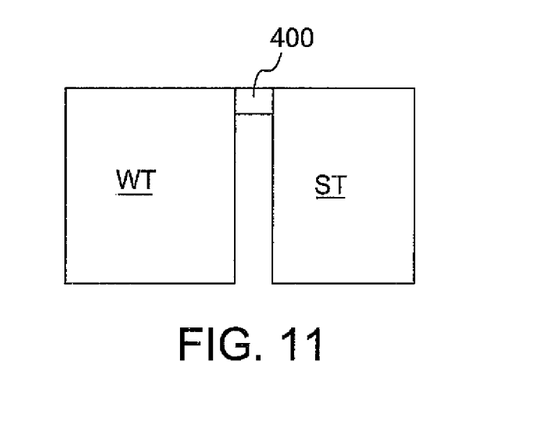
FIG. 11 is a schematic illustration, in cross-section, of a gap between a substrate table and a measurement table being bridged by a seal.

FIG. 11 illustrates a further embodiment. In FIG. 11, a seal 400 is illustrated. The seal 400 may be a seal according to any one of the above embodiments. The seal 400 extends directly between a substrate table WT and a measurement table ST. The substrate table WT and measurement table ST are moveable independently of one another. During swapping of one table for another under the projection system PS and liquid confinement structure 12, the two tables may move together in tandem. During this time the seal 400 closes the gap between the two tables WT, ST so as to have the same advantages as the seal of the above embodiments.

In one embodiment a control system 310 to control operation of the under pressure source 150, 160 is present. The control system 310 may be connected to a routing control 312, so that the gap 115, 125, 135 can be put at an under pressure by the under pressure source 150, 160 when the liquid confinement structure 12 is over the gap 115, 125, 135.

As will be appreciated, any of the above described features can be used with any other feature and it is not only those combinations explicitly described which are covered in this application.

In an aspect, there is provided a lithographic apparatus comprising a table, a component attached to and moveable, in use, relative to the table, and a seal to bridge a gap between the component and the table when the component is in a position relative to the table. Optionally, the seal is integral to the component or integral to the table. Desirably, the seal is stuck with glue or another fastener to the component or the table. Desirably, a top surface of the component and the seal are formed of solid material or a top surface of the table and the seal are formed of solid material. Optionally, the component is moveable at least partly in rotation relative to the table. Desirably, the rotation is about an axis substantially parallel to a top surface of the table. Optionally, the component is moveable at least partly in displacement relative to the table such that during movement to or from the position sliding between the seal and the table or between the seal and the component is substantially avoided. Optionally, the component is a bridge to bridge a gap between the table and a second table of the lithographic apparatus. Optionally, the table is a substrate table. Optionally, the table is a measurement table. Optionally, the lithographic apparatus further comprises a fluid handling structure to provide fluid to a top surface of the component. Desirably, the fluid handling structure is configured to provide fluid to a space between a final element of a projection system and a substrate on the table. Optionally, the seal is deformable by a force generated by an under pressure. Optionally, the lithographic apparatus further comprises an under pressure generator to generate an under pressure in the gap to deform the seal, desirably further comprising a control system to control operation of the under pressure generator. Optionally, the seal is pre-bent such that it does not contact with a sealing face of the component or the table, when the component is in the position, without a force being applied to the seal. Optionally, the seal is less than 50 μm thick, desirably less than 20 μm thick. Optionally, the seal is made of a material which is liquidphobic. Optionally, the seal is made of a material comprising one of stainless steel, PTFE, or a fluoroelastomer. Optionally, the lithographic apparatus further comprises a second seal to bridge a second gap between the component and the table or between the component and a second table. Optionally, the lithographic apparatus further comprises a second table, wherein the component is positionable between the first table and the second table.

In an aspect, there is provided a lithographic apparatus, comprising a table, a component moveable, in use, relative to the table, the component comprising an integral seal to bridge a gap between the component and the table when the component is in a position relative to the table, and an under pressure source to generate an under pressure in the gap. Optionally, the lithographic apparatus further comprises a control system to control operation of the under pressure generator. Optionally, at least a part of the component is positioned between the seal and a space above the component, and/or at least a part of the table is positioned between the seal and a space above the table. Optionally, the lithographic apparatus further comprises a second seal, wherein a first of the seals is positioned to bridge the gap and wherein at least a part of the component is positioned between the first seal and a space above the component, and/or at least a part of the table is positioned between the first seal and a space above the table, and a second of the seals is positioned to bridge the gap and is in contact with or integral to a top surface of the table and/or the component. Desirably, the lithographic apparatus further comprises an under pressure source to generate an under pressure in the gap between the two seals.

In an aspect, there is provided a method of sealing between a table and a component in a lithographic apparatus, wherein the component is attached to and moveable, in use, relative to the table, the method comprising positioning a seal between the component and the table when the component is in a position relative to the table such that the seal bridges the gap between the component and the table. Optionally, the method further comprises placing a free end of the seal on a sealing surface thereby to seal the gap with the seal. Optionally, the method further comprises creating an under pressure in the gap when a liquid confinement structure is positioned over the gap.

In an aspect, there is provided a bridge body for use in a lithographic apparatus to bridge a gap between two tables during substrate swap, the bridge body including a seal to bridge a gap between the bridge body and one of the tables.

In an aspect, there is provided a shutter member which is removably attachable to a bottom of a fluid confinement structure, the shutter member comprising first and second seals, each to seal across a gap between the shutter member and a substrate table when the shutter member is placed on the substrate table, the first and second seals being around edges of opposite surfaces of the shutter member.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:
1. A lithographic apparatus comprising:
a table;
a component moveable relative to the table;
a first seal to bridge a gap between the component and the table when the component is in a position relative to the table;

a second seal positioned to bridge the gap, the second seal located above the first seal and in contact with or integral to a top surface of the table and/or the component; and an opening of the table configured to exhaust fluid from a space between the first and second seals when the first and second seals bridge the gap.

2. The lithographic apparatus of claim 1, wherein the second seal is integral to the component and the first seal is integral to the table.

3. The lithographic apparatus of claim 1, wherein the component is moveable at least partly in rotation relative to the table.

4. The lithographic apparatus of claim 3, wherein the rotation is about an axis substantially parallel to a top surface of the table.

5. The lithographic apparatus of claim 1, wherein the component is moveable at least partly in displacement relative to the table such that during movement to or from the position sliding between the second seal and the table or between the second seal and the component is substantially avoided.

6. The lithographic apparatus of claim 1, wherein the component is a bridge to bridge a gap between the table and a second table of the lithographic apparatus.

7. The lithographic apparatus of claim 1, wherein the table is a substrate table.

8. The lithographic apparatus of claim 1, wherein the table is a measurement table.

9. The lithographic apparatus of claim 1, further comprising a fluid handling structure to provide fluid to a top surface of the component.

10. The lithographic apparatus of claim 9, wherein the fluid handling structure is configured to provide fluid to a space between a final element of a projection system and a substrate on the table.

11. The lithographic apparatus of claim 1, wherein the first and/or second seal is deformable by a force generated by an under pressure.

12. The lithographic apparatus of claim 1, further comprising an under pressure generator to generate an under pressure to deform the first and/or second seal.

13. The lithographic apparatus of claim 1, wherein the first and/or second seal is pre-bent such that it does not contact with a sealing face of the component or the table, when the component is in the position, without a force being applied to the first and/or second seal.

14. The lithographic apparatus of claim 1, wherein the first and/or second seal is made of a material which is liquidphobic.

15. The lithographic apparatus of claim 1, further comprising a third seal to bridge a second gap between the component and the table or between the component and a second table.

16. The lithographic apparatus of claim 1, further comprising a second table, wherein the component is positionable between the first table and the second table.

17. The lithographic apparatus according to claim 1, further comprising an under pressure source to generate an under pressure in the gap via the opening between the first and second seals.

18. A lithographic apparatus, comprising:

a table;

a component attached to and moveable relative to the table, the component comprising an integral seal of same material as the component to bridge a gap between the component and the table when the component is in a position relative to the table; and an opening of the table connected to an under pressure source to generate an under pressure in the gap.

19. A method of sealing between a table and a component in a lithographic apparatus, wherein the component is moveable relative to the table, the method comprising:

positioning a first seal to bridge a gap between the component and the table when the component is in a position relative to the table;

positioning a second seal to bridge the gap, the second seal located above the first seal and in contact with or integral to a top surface of the table and/or the component; and exhausting fluid from a space between the first and second seals when the first and second seals bridge the gap, through an opening of the table.

20. A shutter member which is removably attachable to a bottom of a fluid confinement structure, the shutter member comprising first and second seals, each to seal across a gap between the shutter member and a substrate table when the shutter member is placed on the substrate table, the first and second seals surrounding boundaries of opposite surfaces of the shutter member.

* * * * *